United States Patent [19]

Jagatich

[11] 4,232,302
[45] Nov. 4, 1980

[54] VIDEO SPEED LOGARITHMIC ANALOG-TO DIGITAL CONVERTER

[75] Inventor: Carl T. Jagatich, Chagrin Falls, Ohio
[73] Assignee: Ohio Nuclear, Inc., Solon, Ohio
[21] Appl. No.: 936,328
[22] Filed: Aug. 24, 1978
[51] Int. Cl.³ .......................................... H03K 13/175
[52] U.S. Cl. ............................... 340/347 AD; 328/151; 340/347 M; 340/347 SH
[58] Field of Search .... 340/347 M, 347 AD, 347 SH; 328/151

[56] References Cited

U.S. PATENT DOCUMENTS

| | | | |
|---|---|---|---|
| 3,597,761 | 8/1971 | Fraschilla et al. | 340/347 AD |
| 3,646,548 | 2/1972 | Van Doren | 340/347 AD |
| 3,820,112 | 6/1974 | Roth | 340/347 SH X |

OTHER PUBLICATIONS

The Engineering Staff of Analog Devices, Inc., Analog-Digital Conversion Handbook, 1972, pp. I-29 to 31; III-1 to 4; III-78,79.
Gottschalk, Logarithmic Analog-to-Digital Converter Using Switched Attenuators, 2/1978, Rev. Sci. Instrum., vol. 49, No. 2, pp. 200-204.
Advertising brochure of Goetronix, Inc., AN802OL Logarithmic A/D Converter, 9/1977.
Karlson, On a Temperature Stabilized Wideband Operational Amplifier, 1971, Nucl. Instr. and Meth., 96, pp. 387-395.

*Primary Examiner*—Thomas J. Sloyan
*Attorney, Agent, or Firm*—Fay & Sharpe

[57] ABSTRACT

The video speed logarithmic analog-to-digital converter includes a plurality of parallel paths. In a first path, a plurality of comparators compare an analog input signal with a plurality of logarithmically incremented first reference signals. The number of first reference signals which fail to exceed the analog input signal is converted into a binary representation of the most significant bits of the logarithm of the analog input signal. A second parallel path determines the least significant bits by producing a logarithmically attenuated analog input signal and comparing the attenuated analog input signal with a plurality of logarithmically incremented second reference signals. The number of second reference signals which fail to exceed the attenuated analog input signal is converted into a binary representation of the least significant bits of the logarithm of the analog input signal. A sample and hold circuit having one input, N outputs, N+1 temporary storage paths, and a control for cyclically connecting the stored analog values with the outputs is connected with the logarithmic converter.

19 Claims, 2 Drawing Figures

VIDEO SPEED LOGARITHMIC ANALOG-TO DIGITAL CONVERTER

BACKGROUND OF THE INVENTION

This application pertains to the art of video signal processing and, more particularly, to video speed logarithmic analog-to-digital converters. The invention is particularly applicable for use with electronic equipment using a television-type display or other video speed apparatus and will be described with particular reference thereto. It will, however, be appreciated that the invention has broader applications in other areas of high speed data acquisition and processing.

Conventionally, conversion of analog signals to logarithmic digital representations is performed as a two-step process. Most normally, analog signals are first converted with an analog logarithmic amplifier to an analog logarithmic representation. Then, the analog logarithmic representation is converted with a linear analog-to-digital converter to a digital representation of the analog logarithmic signal. The final results after a two-step process is a digital representation of the logarithm of the analog signal.

One of the principal problems with the prior logarithmic analog-to-digital converters is the relatively low speeds for making the conversion. The conversion time for converting an analog signal to a logarithmic digital representation with the prior art converters is typically several microseconds.

Another problem with prior logarithmic analog-to-digital converters is poor conformity with the logarithmic scale. Prior art logarithmic analog-to-digital converters frequently use linear approximations which deviate to some extent from the true logarithmic scale.

Yet another problem with prior logarithmic analog-to-digital converters has been a poor dynamic response. Logarithmic amplifiers have long decay transients relative to video speeds. These procedure relatively inaccurate analog signals for the linear analog-to-digital converter to convert.

The present invention contemplates a new and improved apparatus which overcomes all of the above-referred problems and others, yet provides high speed signal processing with moderately simple and inexpensive circuitry.

In accordance with the present invention, there is provided a high speed logarithmic analog-to-digital converter. It includes a multiple path logarithmic analog-to-digital converter in which each successive path converts an analog input signal to one or a group of progressively less significant bits of the logarithm. A novel series sample-and-hold circuits are also provided. The high speed sample-and-hold circuits are suited for use with high speed signal processing circuitry including, but not limited to, high speed logarithmic analog-to-digital converters as disclosed herein.

A principal advantage of the present invention is video speed conversion of analog data into logarithmic digital data.

A further advantage of the present invention is extremely accurate logarithmic conformance.

Other advantages include an extensive dynamic range and a digital output which is independent of prior analog inputs.

SUMMARY OF THE DRAWINGS

The invention may take physical form in certain parts and arrangement of parts a preferred embodiment of which will be described in detail in the specification and illustrated in the accompanying drawings which form a part hereof.

DESCRIPTION OF THE PREFERRED EMBODIMENT

Figure 1:
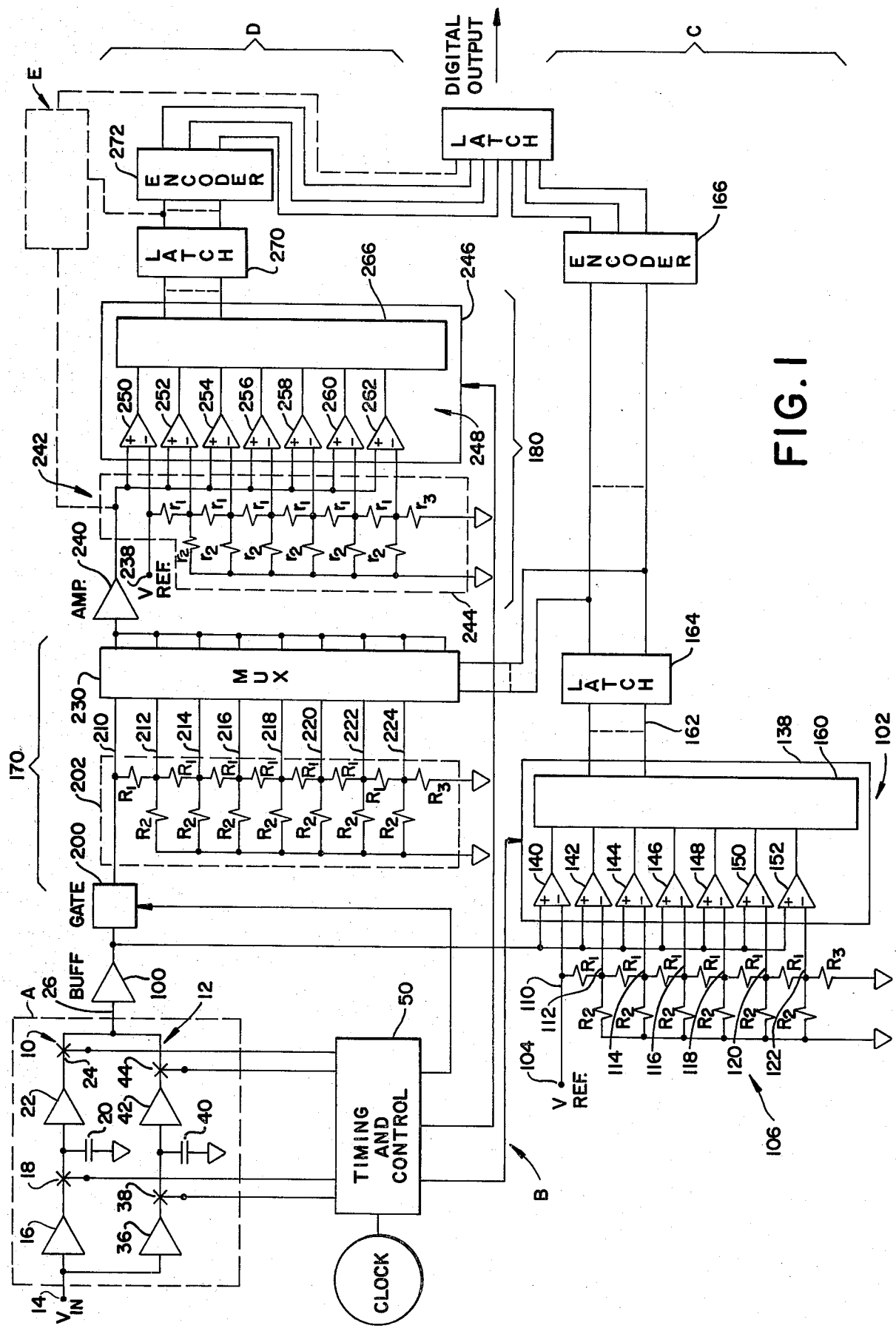
FIG. 1 shows an embodiment of a video speed sample-and-hold circuit in combination with a video speed logarithmic analog-to-digital converter in accordance with the invention.

Referring now to the drawings wherein the showings are for the purposes of illustrating a preferred embodiment of the invention only and not for purposes of limiting the same, the figures show a sample-and-hold circuit A which has at least two series storage paths 10 and 12. As a series or continuum of analog data are presented at video speed, i.e. above one megahertz, to the input to the sample-and-hold circuit, a first of the paths, e.g. 10, of the circuit will sample the input analog data and store an analog representation of an instantaneous analog data amplitude. At the same time, a second of the series path, e.g. 12, will display on the output of the sample-and-hold circuit a previously stored analog representation. The first and second series paths alternate functions as successive substantially instantaneous analog input data amplitudes are sampled.

Connected to the output of the sample-and-hold circuitry A is a video speed logarithmic analog-to-digital converter B which converts the series of analog output data representations from the output of the sample-and-hold circuit directly to a digital representation of the logarithm of the analog data at a rate in excess of 1 million conversions per second.

The analog-to-digital converter is made up of a series of parallel paths. A first parallel path C receives an analog input signal and converts it to the most significant bits of the digital logarithmic representation. A second parallel path D attenuates or reduces the analog input signal to an attenuated analog input signal having an amplitude within its operating range and converts the attenuated analog input signal to a digital representation which is a group of the next most significant bits of the digital logarithmic representation of the input analog signal. In the preferred embodiment, there are two paths and each path produces three significant bits of the representation, the three bits of the second path from the least significant bits. For greater accuracy, the error in the digital representation produced by the first two paths may be further refined by a third or subsequent parallel paths E to produce additional less significant bits of the digital representation.

By way of background, a digit or bit contributes to the accuracy or precision of a numeral. The number of significant bits are counted beginning with the bit contributing the most value called the most significant bit and ending with the bit contributing the least value called the least significant bit.

Looking specifically to FIG. 1, sample-and-hold circuit A comprises a pair of series connected paths 10 and 12. Analog data to be converted is received at means 14 for receiving analog input signals which means is common to both parts 10 and 12. This data may, for example, be in the form of a continuously varying analog voltage as produced, for example, a video camera.

Path 10 comprises a storage element 20 for temporarily storing an analog value. The storage element is connected to receiving means 14 by a serially connected buffer 16 and gate means 18. Buffer 16 has a high impedance input and a low impedance output to limit the flow of analog data unidirectionally from the receiving means to the storage means. Gate 18 acts to connect and disconnect storage element 20 with receiving means 14. Also connected to the storage element is another buffer 22 again having a high impedance input and low impedance output in series with another gate means 24. Gate means 24 acts to connect and disconnect the storage element 20 with a sample and hold output 26.

The second serial path 12 is structurally the same as the first parallel path. It consists of a storage element 40 connected to receiving means 14 by a buffer 36 and a gate means 38. Connecting storage element 40 to output 26 is another buffer 42 and another gate means 44. In the preferred embodiment the analog input signals are in the range of 0 to 10 volts and storage means 20 and 40 are 560 p.f. capacitors.

In operation, the four gate means 18, 24, 38 and 44 act in conjunction with each other to form a switching means for alternately connecting one of the storage elements 20 or 40 to receiving means 14 and the other of the storage elements to output 26. For example, at one instant in time, gate means 18 and 44 will be closed and gate means 24 and 38 open and at another instant vice versa. For example in a first sampling period only storage element 20 is connected to receiving means 14 to sample the analog input data presented and only storage element 40 is connected to the output so that its stored analog voltage representation may be read by converter B. The switching means will remain in this state for one sampling period. This period, of course, may vary but for the logarithmic analog-to-digital converter to be described below, the sampling period will be on the order of 80 to 1,000 nanoseconds or less. After this first sampling period, a timing and control circuit 50 causes the switching means to reverse the state of gates 18, 24, 38 and 44 such that only storage element 40 is connected to receiving means 14 while only storage element 20 is connected to output 26.

The analog data representation at output 26 forms the analog input signals to logarithmic analog-to-digital converter B. An input buffer 100 serves to isolate the preceding sample-and-hold circuitry from signals in the converter. Connected to buffer 100 are first parallel path C and second parallel path D. First path C comprises a first comparing means 102 which compares the analog signal to a plurality of logarithmically incremented reference signals. The logarithmically incremented reference signals are derived by attenuating a reference signal from means 104 for receiving a first reference signal. In the preferred embodiment the reference signal is a voltage signal.

The first reference signal receiving means 104 is connected to a first logarithmic attenuator 106 which attenuates the first reference signal in logarithmically regular increments. This attenuator, in the preferred embodiment, consists of a ladder grid of resistive element in which typical resistive values are $R_1$ equals 100 ohms, $R_2$ equals 150 ohms and $R_3$ equals 90.9 ohms. The first reference attenuator has a series of outputs each of which carries the first reference signal decreased by an equal first logarithmic increment, in the preferred embodiment seven increments of eight decibels each. By way of definition the number of decibels denotes the ratio of two amounts of power, voltage or current and is 20 times the logarithm to the base 10 of this ratio. For example, attenuating a reference signal by 8 decibels produces a signal equal to the reference signal divided by 10 exp. (8/20). Attenuating the signal by another 8 decibels produces a signal equal to the reference signal divided by 10 exp. (16/20). Although decibels conventionally are defined in base 10, the present converter is not limited to converting to base 10 logarithms. To convert to natural logarithms or logarithms of other bases, the resistors are selected so that the first logarithmic increments are in terms of the selected base. For example, for natural logarithms the increments could be $e^{8/20}$.

In the preferred embodiment the attenuator 106 has seven outputs—the first output 110 carries the reference voltage itself; the second output 112 carries the reference voltage attenuated by 8 decibels; the third output 114 carries the reference voltage attenuated by 16 decibels; the fourth output 116 carries the reference voltage attenuated by 24 decibels; the fifth output 118 carries the reference voltage attenuated by 32 decibels; the sixth output 120 carries the reference voltage attenuated by 40 decibels; and the seventh output 122 carries the reference voltage attenuated by 48 decibels.

Thus, the attenuator 106 provides seven voltages which mark the boundaries between eight voltages ranges. The reference voltage received by receiving means 104 is preselected to be the maximum analog input voltage which the converter is designed to accommodate attenuated by 7 decibels. Other numbers of comparators may be used to mark the eight ranges or to mark other numbers of ranges.

Connected to the outputs of the logarithmic attenuator 106 is a flash converter 138. The flash converter 138 includes as subcomponents a series of comparators which may be operational amplifiers. These comparators each compare the analog input voltage with the plurality of first attenuated reference voltages. An operational amplifier 140 compares the analog voltage with the reference voltage and assumes a high or low state depending on whether the analog input voltage exceeds or fails to exceed the reference voltage. Similarly, an operational amplifier 142 compares the analog input voltage to the reference voltage attenuated by 8 decibels and assumes a high or low state depending whether or not the analog input voltage exceeds or fails to exceed this attenuated reference voltage. In an analogous manner, operational amplifiers 144, 146, 148, 150 and 152 each compare the analog voltage to the reference voltage attenuated by a progressively greater logarithmic increment. The flash converter means 138 may also contain a sampling means 160 for monitoring the state of each of the operational amplifiers. A plurality of output lines 162, in the preferred embodiment seven lines, carry signals indicating the high or low state of the individual operational amplifiers one per line. Alternately, the sampling means may perform a multiplexing function and transform the state of the operational amplifiers into a series of high and low pulses which are conveyed serially along a single output line.

The output 162 of the flash comparator is conveyed through a latch 164 to a first encoder means 166. Encoder means 166 transforms the seven digitized high and low signals into a binary representation having three bits. This representation forms the three most significant bits of the binary representation. The count of a number of logarithmic increments is, of course, a logarithm. Thus, by counting the number of comparators indicating that their attenuated reference signal fails to exceed the analog input, a logarithmic indica of the greatest test attenuated reference signal equal to or less than the analog input signal is obtained. This logarithm is an approximation of the logarithm of the analog input signal accurate to within the logarithm attenuation increments between reference signals.

By way of example, if z comparators indicate that their attenuated reference voltage fails to exceed the analog input, encoder 166 produces z in binary as the most significant bits of the log. Greater clarity may perhaps be derived by looking to the mathematics behind this statement. It is, of course, a property of logarithms that $$\log\ Vin = \log\ (Vin \times a)/a = \log\ a + \log\ Vin/a$$

where a is any quantity. In the preferred embodiment, a is the attenuation $10^{8z/20}$ and log a is $8z/20$. In binary 8 is represented as 1000, so the 8 merely indicates that there are three zeros after $z/20$.

The analog input signals will never exceed the attenuated reference voltage closest to but not above the analog input by more than 8 decibels, in the preferred embodiment, because the next greatest attenuated reference voltage is always only 8 decibels more. Thus, the approximation of $$\log\ Vin \approx 8z/20 = \log\ 10^{8z/20}$$

is accurate to within 8 decibels, i.e. The greatest binary error is 1000, and log $10^{8z/20}$ varies (in binary) from 0000 to 111000 in 1000 decibel steps. Thus, encoder 166 which generates only the first three digits produces outputs from 000 to 111.

For more accuracy path D is used to determine the last three binary digits. In mathematical terms path D determines or approximates the logarithm of the error in the above approximation. That is, path D evaluates the logarithm of $$Vin/10^{8z/20}$$

It will be appreciated that path C may convert the analog input signal into more or less bits of the binary representation. If the number of bits of binary representation desired is y, then comparator means 102 compares the analog input signal with $(2^y-1)$ logarithmically incremented first reference signals each incremented by M decibels. Thus, to obtain four binary bits from encoder 166, the number of operational amplifiers becomes 15 rather than 7. On the other hand, to reduce the number of bits from 3 to 2, the number of operational amplifiers is reduced from 7 to 3. The number of operational amplifiers may be other than $(2^y-1)$. Similarly, varying the decibel increments M varies the accuracy because the logarithmic value determined by path C is accurate to M decibels.

Path D includes means 170 for producing an attenuated analog input signal. The attenuated analog input signal is equal to the analog input signal divided by $10^{zM/20}$, i.e. the analog input signal divided by $10^{zM/20}$ times to produce the signal $Vin/10^{zM/20}$. This signal was discussed above in relation to the preferred embodiment in which M=8 as the error in approximating the log Vin as zM. Path D further includes a means 180 for approximating the logarithm of the attenuated analog input signal which is analogous to path C. Thus, path D connects the error or at least refines the approximation to within a smaller error.

Turning to the details of the second parallel path D, it can be seen that D is likewise connected with buffer 100 to receive the analog input signal from analog data output 26. A gate means 200 controls the input to the second parallel path. It is connected to timing and control means 50 and may be used to delay the analog signal from entering the second parallel path slightly relative to the signals entering the first parallel path. Connected to gate 200 is means 170 for producing the attenuated analog input voltages which includes a second logarithmic attenuator means 202 and a selector means 230. The second logarithmic attenuator means like the first logarithmic attenuator means 106 comprises a ladder network of resistive elements. Unlike the first attenuator logarithmic attenuator means 106, it is designed to attenuate the analog input signal in eight increments of 8 decibels rather than a reference signal in seven increments of eight decibels.

In the preferred embodiment, the second logarithmic attenuator 202 is identical to the first logarithmic attenuator 106 except for the additional steps of the resistive latter. The second logarithmic attenuator means 202 attenuates the analog input signal in eight increments of M decibels per increment, where as in attenuator means 106 M=8. Thus, on a first output line 210, the analog signal appears unattenuated; on a second output line 212, the analog signals appears attenuated by 8 decibels; on a third line 214, the analog signal appears attenuated by 16 decibels; and so forth until on an eight line 224, the signal is attenuated by 56 decibels. Connected to logarithmic attenuator 202 and latch circuit 164 of the first parallel path is selecting means 230 for selecting the attenuated analog input signal. In particular it selects the output of logarithmic attenuator 202 which attenuates the analog input signal by $10^{8z/20}$, i.e. an amount corresponding to the antilog of the logarithm determined by path C. To do this it selects the zth attenuated output which is 210 for z=0, 212 for z=1, 214 for z=2, etc. For example, if comparator 150 receives the greatest attenuated reference signal not greater than the analog input signal, i.e. z=2 then means 230 selects the output with the analog input signal attenuated by 2 M or 16 decibels, i.e. output 214.

Connected to the selecting means 230 which in the preferred embodiment is a multiplexer is an amplifier 240 which amplifies the attenuated analog input signal to make it more compatible to the circuitry which follows. A typical gain is 36. The amplifier 240 should be a high speed, high stability and low bias current amplifier. Generally, commerically available amplifiers require a time on the order of at least 50 nanoseconds to process and amplify an analog signal. While this length of time would still enable a logarithmic analog-to-digital conversion at video speeds, it has been found desirable, especially for higher video speeds, to use a faster amplifier. It has been found that an amplifier built in accordance with the article "On a Temperature Stabilized Wideband Operational Amplifier", by L. Karlsson, Nuclear Instruments and Methods 96, pages 387–395 (1971) requires a time on the order of 20 nanoseconds to process and amplify an analog signal. It has been found highly desirable to add to the amplifier disclosed in the above article a current mirror feedback arrangement which reduces the bias current by two orders of magnitude. Alternately, the bias current can be reduced with an emitter follower implementation added to the front end such as to form a Darlington pair. The use of a 20 nanosecond amplifier instead of a 50 nanosecond amplifier reduces the total conversion time by 30 nanoseconds to in the preferred embodiment about 80 nanoseconds.

Connected to amplifier 240 is means 180 for approximating the logarithm of the attenuated analog input signal comprising a second comparator means 242 for comparing the attenuated analog input signal with a plurality of second logarithmically attenuated reference signals. The second comparator includes a third logarithmic attenuator circuit 244 which attenuates a reference signal received at second reference signal receiving means 238 in logarithmically regular increments. In the preferred embodiment, logarithmic attenuator 244 attenuates the reference signal in seven steps of one decibel per step, i.e. breaks the 8 decibel increments of comparator 102 into 1 decibel increments. Thus, path C was accurate in binary to 1000 whereas path D produces outputs of 000 to 111 and is accurate to within 001. Attenuator 244 may again be a resistive ladder work in which typical resistive values are $r_1$ equals 750 ohms, $r_2$ equals 10 ohms and $r_3$ equals 9.9 ohms. Connected with amplifier 240 and the third logarithmic attenuator 244 is a second flash converter 246. Flash converter 246 again includes a plurality of comparator means 248 which compares the attenuated analog input signal with the plurality of second logarithmically incremented reference signals. The comparators again may take the form of operational amplifiers. A first operational amplifier 250 has one input from amplifier 240 and the other input from means 238 for receiving a second reference signal. Operational amplifier 250 assumes a high or low state depending upon whether or not the attenuated analog input signal as amplified exceeds the reference signal received at receiving means 238. Similarly, a second operational amplifier 252 compares the attenuated analog input signal with the reference signal attenuated by 1 decibel. A third operational amplifier 254 compares the analog voltage with reference signal attenuated by 2 decibels. Simiarly, operational amplifiers 256, 258, 260 and 262 each compare the attenuated analog input signal with the reference signal attenuated by 3, 4, 5, and 6 decibels, respectively. In the preferred embodiment the reference signal received at receiving means is a voltage equal to the voltage on line 122 of attenuator 106 attenuated by one attenuation increment of attenuator 244, one decibel, adjusted for the gain of amplifier 240. Thus, comparator has eight possible outputs, on each from comparing the attenuated analog input signal with the maximum input voltage attenuated by 57, 58, 59, 60, 61, 62 and 63 decibels and zero for attenuated analog input signals smaller than the maximum input voltage attenuated by 63 decibels.

Optionally, a second sampling means 266 may monitor the state of the operational amplifiers and produces a series of high and low outputs to a latch circuit 270 and, in turn, to a second encoder means 272. The encoder 272 transforms the 7 high or low signals into a 3 bit binary representation which 3 bits are the fourth, fifth, and sixth most significant bits of the digital representation of the analog signal.

Further, bits of accuracy can be achieved with additional parallel paths E. A third parallel path may be connected to amplifier 240 and latch 270 to provide an output representing the group of next most significant binary bits.

It will be seen that if it is desired that encoder means 272 produce x bits of digital representation, then comparator means 242 should compare the attenuated analog signal from amplifier 240 with $(2^x-1)$ logarithmically incremented reference voltages each incremented by N decibels. Further, for compatability between paths C and D, the number of decibels of attenuation between outputs of attenuator 106, M, should be equal to $2^x N$. In the preferred embodiment, x equals 3 and N equals 1.

In the preferred embodiment, analog input signals are in the range of 0 to 10 volts. The maximum analog input voltage, 10 volts, is assigned the binary logarithm of 111 111, in decimal 63. On the other end of the binary log scale is 000001 which is the log of the voltage equal to the maximum analog input voltage equal to 10 volts attenuated by 63 decibels, i.e. 10 10 exp (63/20) volts or 7 millivolts. The other binary outputs correspond logarithmically to logarithms between 7 mv and 10 v.

As indicated above, the reference voltage on line 110 is the maximum analog input voltage attenuated by 7 decibels, i.e. 4.46 v. Similarly the voltages on lines 112, 114, 116, 118, 120 and 122 are respectively 1.78 v, 0.71 v, 0.28 v, 0.11 v, 0.045 v and 0.0178 v.

If 7 mv is defined as 1 unit, then 10 volts is 10,000/7 or 1429 units. The square root of 1429 units is roughly 37.9 units which is the equivalent of 37.9×7 or 265.3 mv. It is a property of logarithms that the logarithm of the square root of a quantity is half the logarithm of the quantity. Thus, if the present converter has logarithmic conformity, then an input of 265.3 mv should produce and output of 63/2 or 31 plus a remainder. In binary this is 011 111.

For an exemplary analog input voltage of 265.3 mv volts, the attenuated reference voltages to the inputs of three of the comparators in flash converter 138. Thus, encoder 166 produces the binary output of 011.

From second attenuator 202 selector 230 selects the output in which the analog input signal has been attenuated by 24 decibels. Attenuating 265.3 mv. by 24 decibels produces an attenuated analog input signal of 16.8 mv.

The second reference voltage received by receiving means 238 is 0.0178 volts as on line 122 attenuated by 1 decibel, i.e. 0.0159 volts or 15.9 mv. The other six second attenuated reference signals are 14.2 mv, 12.6 mv, 11.3 mv, 10.1 mv, 9.0 mv and 7.1 mv.

Thus, the attenuated analog input of 16.8 mv matches or exceeds all seven of the second attenuated reference signals. Encoder 272 transforms this into 111.

Thus, the binary representation of the logarithm of 265.3 mv is 011111 or 31, as expected. Further, the attenuated analog input signal exceeded the 15.9 mv. reference signal so there is a remainder which could be evaluated by a third or subsequent path.

Figure 2:
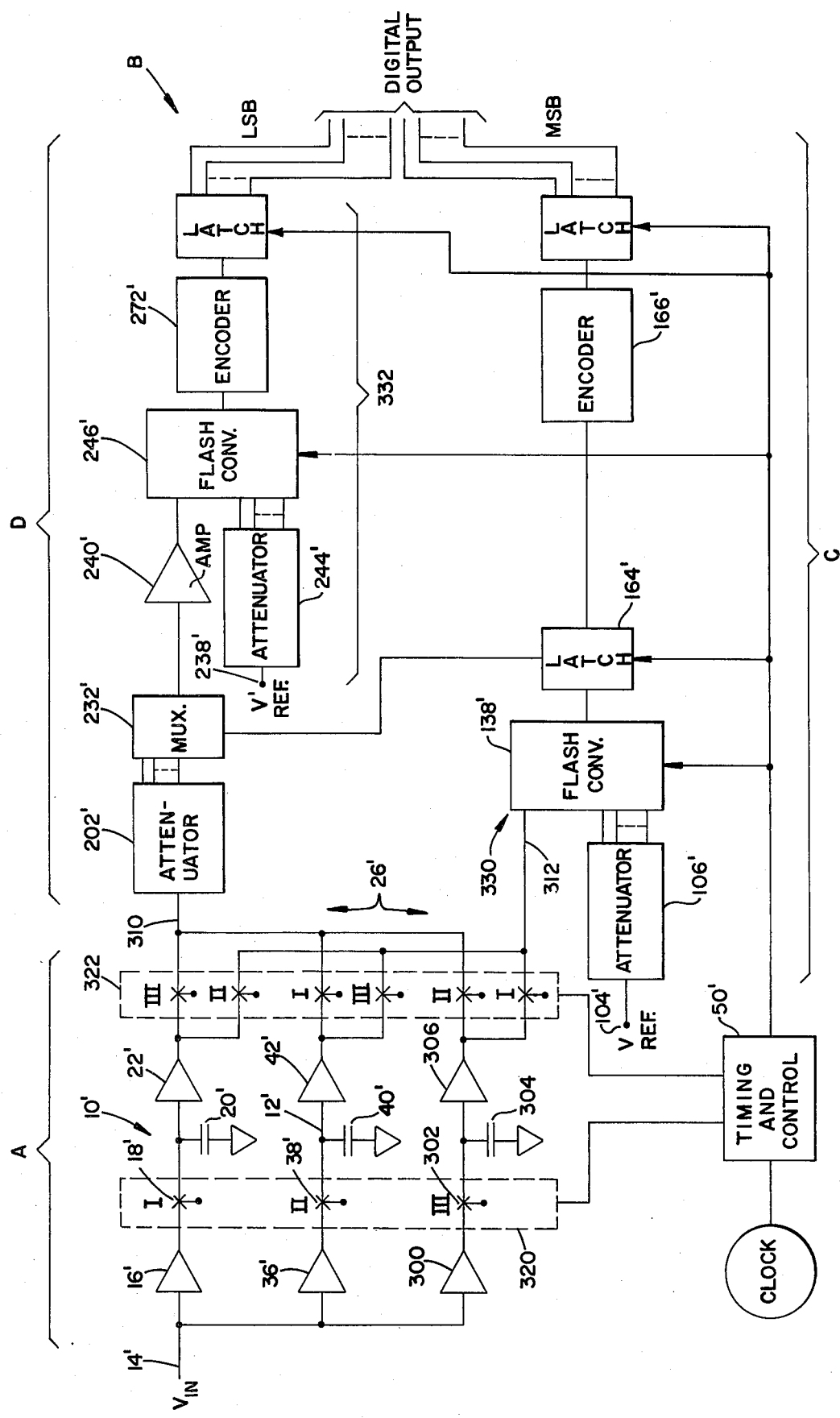
FIG. 2 shows an alternate embodiment of a three path sample-and-hold circuit in combination with a logarithmic analog-to-digital converter in accordance with the present invention.

FIG. 2 represents an alternate to the embodiment shown in FIG. 1 in which like elements are marked with the same reference numeral followed by a prime ('). In the embodiment of FIG. 2, the sample-and-hold means consists of three serial sample-and-hold paths. The third sample-and-hold path like the first and second paths 10' and 12', consists of a high impedance input and low impedance output buffer 300. Connected to the buffer is a gate means 302 for connecting or disconnecting a storage element 304 with means 14' for receiving an analog input. Connecting storage element 304 to output 26' is a second buffer 306 and a pair of gate means. The output of the three buffers 22', 42' and 306 are able to be connected with neither or one of two lines 310 and 312 which together form the output 26' of the sample-and-hold means A. The switching means includes a first switching unit 320 comprising gates 18', 38' and 302 controlled by timing and control means 50'. Timing and control means 50' cyclically connects each one of the storage elements 20', 40' or 304 to the input receiving means 14'. The switching means also includes a second switching unit 322 for connecting the storage element which is connected to input receiving means 14' to neither of the output lines, and connecting the storage element which has most recently been connected to input receiving means 14' with output line 312, and connecting the other storage element with output line 310. Thus, as analog data is received at input means 14' for sampling, output line 312 displays the preceding sampled analog data and line 310 displays the penultamate sampled analog data.

By way of example, take a cyclic order in which the gate means of the first switching unit are closed in the order of gate means 18', then gate means 38', the gate means 302 and back to gate means 18' repeating the cycle. When gate means 18' is closed, storage element 20' is sampling the analog data. The analog data stored in the storage element 304 is the preceding sampled data and the analog data stored in storage element 40' is the penultamate sampled data. Thus, second switching 322 connects storage element 304 to line 312 and storage element 40' to line 310. For convenience, the various gates in the switching means have been marked with Roman Numerals I, II and III using the convention that simiarly marked gate means are closed together and only gate means with one given marking are closed at the same time.

In the next incremental sampling period, storage element 40' samples the signal presented at the input, storage element 20' becomes the repository of the preceding sampled data and is connected to line 312, and storage element 304 becomes the repository of the penultamate sampled signal and is connected to line 310. Thus, each analog signal is sampled, temporarily held, displayed on line 312 and then displayed on line 310.

This sample-and-hold implementation enables the logarithmic analog-to-digital converter to operate at higher speeds. The most recently acquired analog signal is conveyed to a first logarithmic conversion means 330, comprising a logarithmic attenuator 106' for a first reference voltage received at first reference voltage receiving means 104' and a flash converter 138'. Conversion means 330 converts the analog signal to a digital representation which is stored temporarily in latch 164'. The converter 138' is cleared as the switching means changes one cyclic increment causing the second switching unit 322 to connect the stored analog data just converted to converter 138' from line 312 to line 310, and placing the subsequented sampled analog signal on line 310. While converter 138' is converting the subsequently sampled analog input signal to a digital representation, the digital representations stored in latched 164' is being transformed by encoder means 166' to binary representation of the most significant bits of the digital representation. Simultaneously, the analog input signal on line 310 which corresponds to representation held in latch 164' is attenuated logarithmically by second attenuator means 202'. Under the control of latch 164', selecting means 232' selects the appropriate attenuated analog input signal to a second logarithmic conversion means 332. Conversion means 332 includes a flash converter 246' which compares the attenuated analog input signal with a plurality second reference signals. The plurality of reference signals are obtained when third attenuator means 244' attenuates a reference signal received at receiving means 238' at logarithmically regular intervals. This converts the attenuated analog input signal into a logarithmic digital representation.

As converter 246' makes its conversion, the switching means 322 is again stepped one more cyclic step; latch 164' is cleared and receives a subsequent representation from flash converter 138'; converter 138' starts converting yet a third analog input signal to a digital representation; and enclnder 272' generates the least significant bits of the first analog input signal converted. Thus, the first and second parallel paths of the analog digital converter are synchronously processing the most and least significant bits of the digital representation of analog inputs. This speeds up the conversion time by eliminating the delay caused while some components wait for other components to perform their functions.

It will be appreciated that the third or additional parallel paths of the analog converter may be used with corresponding additional serial paths of the sample-and-hold circuitry coordinated therewith.

The invention has been described with reference to the preferred embodiments thereof. Obviously, modifications and alterations will occur to others upon reading and understanding of the specification. It is my intention to include all such modifications and alterations insofar as they come within the scope of the appended claims with the equivalence thereof.

I claim:

1. A high speed logarithmic analog-to-digital converter comprising:
   (a) means for receiving an analog input signal;
   (b) means for producing a first plurality of logarithmically incremented reference signals;
   (c) a first comparing means operatively connected with said analog input and with said first plurality of reference signals for comparing an analog input signal with the first plurality of reference signals to ascertain at least one of said first reference signals to which the analog input signal is comparable;
   (d) means operatively connected with the first comparing means for forming a first digital representation of the comparable first reference signal;
   (e) means for producing an attenuated analog input signal, said attenuated analog input signal producing means operatively connected with said analog input signal receiving means;
   (f) means for producing a second plurality of logarithmically incremented reference signals;
   (g) a second comparing means operatively connected with said means for producing an attenuated analog input signal and said means for producing a second plurality of logarithmically incremented reference signals for comparing said attenuated analog input signal with the second plurality of reference signals to ascertain at least one of said first reference signals to which the selected analog input signal is comparable; and
   (h) means operatively connected with said second comparing means for forming a digital representation of the comparable second reference signal.

2. The converter as set forth in claim 1 further including first encoder means for transforming said first digital representation into a first binary representation, said first encoder means operatively connected with said means for forming a first digital representation.

3. The converter as set forth in claim 1 further including sample and hold means operatively connected with said means for receiving an analog input comprising first temporary storage means operatively connected to said analog input receiving means for sampling and storing an analog input signal; second temporary storage means operatively connected with said analog input receiving means for sampling and storing an analog input signal; and switching means for alternately causing one of said temporary storage means to sample and hold an analog input signal and the other to be connected with said first comparing means and with attenuated analog input signal producing means.

4. The converter set forth in claim 5 further including sample and hold means operably connected with said analog input receiving means comprising at least first, second and third temporary storage means each connected with said analog input receiving for sampling and storage analog input signals from a high frequency series of analog input signals applied to said analog receiving means and switching means for cyclically causing each one of said temporary storage means to be serially connected with the analog input receiving means for sampling and storing serially presented analog signals and for cyclically causing each one of said temporary storage means to be connected with said first comparing means and with said means for producing an attenuated analog input signal.

5. The converter as set forth in claim 1 wherein said means for producing an attenuated analog input signal produces an attenuated analog input signal corresponding to the analog input signal attenuated by the antilog of said first digital representation.

6. The converter as set forth in claim 5 further including first encoder means operatively connected with said first digital representation forming means for transforming said first digital representation into a y bit binary representation of the y most significant bits and a second encoder means operatively connected with said second digital representation into an x bit binary representation of the x next most significant bits, where x and y are integers.

7. The converter as set forth in claim 1 wherein said comparable first reference signal is the reference signal with a magnitude less than said analog input signal, and wherein said means for producing an attenuated reference signal comprises:

means for attenuating the analog input signals in logarithmic increments to produce a plurality of logarithmically attenuated signals, said analog input logarithmic increments substantially equal to logarithmic increments of said means for producing a first plurality of logarithmically incremented reference signals; and means for selecting from said plurality logarithmically attenuated signals said attenuated analog input signal, said selecting means operatively connected with said analog means for attenuating said analog input signal.

8. The converter as set forth in claim 7 wherein said means for producing a first plurality of attenuated reference signals produces $(2^Y-1)$ reference signals at M decibel increments where y is an integer and M is a predetermined increment, and said attenuating means produces $(2^Y-1)$ attenuated analog signals at M decibel increments whereby said attenuated references signals have magnitudes equal to a first reference signal attenuated by 0 to $(2^Y-2)$ M decibels and said attenuated analog input signals have magnitudes equal to the analog input signal attenuated by 0 to $(2^Y-1)$ M decibels.

9. The converter as set forth in claim 8 wherein said comparable reference signal is said first reference signal attenuated by $(2^Y-2-z)$ M decibels where z is an interger between 0 and $(2^Y-2)$ inclusive and wherein said selecting means selects from the plurality of logarithmically attenuated signals, a logarithmically attenuated signal which has a magnitude equal to the magnitude of the analog input signal attenuated by z M decibels for the attenuated analog input signal.

10. The converter as set forth in claim 6 wherein said first attenuator has at least $(2^y-1)$ outputs whereby said first comparator compares said analog input signal with at least $2^y-1$ reference signals at M decibel increments, and wherein said second attenuator has $2^y$ outputs whereby the second attenuator attenuates the analog input signal in increments of M decibels from 0 to $(2^y-1)$ M decibels, and wherein said third attenuator at least has $(2^x-1)$ outputs whereby said second comparator compares said selected analog input signal with $(2^x-1)$ reference signals at N decibel intervals; and wherein $M=N2^x$.

11. The converter as set forth in claim 10 where $x=3$, $y=3$, $M=8$ and $N=1$.

12. The converter as set forth in claim 6 further including means operably connected with said second comparing means for producing additional significant bits of said binary representation.

13. A high speed logarithmic analog-to-digital converter comprising:
 (a) means for receiving an analog input signal;
 (b) means for producing a first plurality of logarithmically incremented reference signals, said means for producing a first plurality of logarithmically incremented reference signals comprising means for receiving a first reference signal having a predetermined magnitude, a first attenuator means operatively connected with said first reference signal receiving means for attenuating the first reference signal by increments of M decibels where M is a predetermined increment, said first attenuator means having a plurality of outputs, each output adapted to carry one of the first plurality of logarithmically incremented reference signals whereby the first plurality of logarithmically incremented reference signals are incremented in M decibel increments;
 (c) a first comparing means operatively connected with said analog input and with said first plurality of reference signals for comparing an analog input signal with the first plurality of reference signals to ascertain at least one of said first reference signals to which the analog input signal is comparable;
 (d) means operatively connected with the first comparator means for forming a first digital representation of the comparable first reference signal;
 (e) second attenuator means operatively connected with said analog input for attenuating an analog input signal by increments of M decibels, said second attenuator having a plurality of outputs, each output carrying an attenuated analog signal whereby each attenuated analog signal is said analog input signal attenuated by a multiple of M decibels;

(f) selecting means operatively connected with said second attenuator and said first comparator means for selecting a second attenuator output corresponding to said comparable first reference signal;

(g) means for producing a second reference signal having a second predetermined magnitude;

(h) a third attenuator means operatively connected with said second reference signal producing means for attenuating said second reference signal by increments of N decibels;

(i) second comparing means operatively connected with said selecting means and said third attenuator for comparing said selected analog input signal with the second reference signal attenuated by multiples of N decibels to ascertain at least an attenuated second reference signal to which the selected analog input signal is comparable; and (j) second digital representation forming means operatively connected with said second comparing means for forming a second digital representation of the comparable attenuated second reference signal.

14. The converter as set forth in claim 13 wherein said first comparing means includes a plurality of comparators each having at least two inputs, each said comparator adapted to assume one of at least two states indicating which input has a signal of greater magnitude, one input of each comparator operatively connected with said analog receiving means and another input of each comparator operatively connected with one of the plurality of outputs of said first attenuator means whereby the comparators assume different states indicating which of said first plurality of logarithmically incremented reference signals an analog input exceeds and fails to exceed.

15. A circuit comprising in combination a sample and hold circuit and a processing circuit, wherein said sample and hold circuit comprises at least a first and a second temporary storage path connected between an analog input receiving means for receiving analog signals and a first analog output, said first temporary storage path comprising a first gate means for allowing or prohibiting an analog signal received at said analog input receiving means to be conducted through the first gate means, a first storage means operatively connected with said first gate means, and a second gate means for prohibiting or allowing an analog signal stored in the first storage means to be conducted to said first analog output; said second temporary storage path comprising a third gate means for allowing or prohibiting an analog signal received at said analog input receiving means to be conducted through the third gate means, a second storage means operatively connected with said third gate means, and a fourth gate means for prohibiting or allowing an analog signal stored in said second storage means to be conducted to said first analog output; and control means operatively connected to the first, second, third and fourth gate means for alternately allowing an analog signal received at said analog input receiving means to be sampled and stored by one of said first and second storage means while a stored analog signal on the other of said storage means is conducted to said first analog output; and wherein said processing circuit comprises a parallel path logarithmic analog-to-digital converter comprising a first path comprising a first flash converter operatively connected to said first analog output for receiving an analog signal, said flash converter including generally ($2^y-1$) first comparators where y is an integer each first comparator comparing the analog output signal with one of ($2^y-1$) first reference signals each of the first reference voltages differing from the others by M decibels where M is a preselected interval, means for sampling the ($2^y-1$) first comparators and encoder means operatively connected to said sampling means for producing a binary representation of the y most significant bits describing the analog signal; and a second path comprising an attenuator means operatively connected to said first analog output for attentuating the analog signal in $2^y$ attenuations of M decibels per attenuation, selecting means operatively connected with said attenuator means for selecting the attenuated analog signal attenuated by z M decibels where z is the number of first comparators which compared the analog signal with a reference signal lower than the analog signal, and a second flash converter operatively connected to said selecting means including generally ($2^x-1$) comparators each comparator comparing the selected analog signal with one of ($2^x-1$) reference signals where x is an integer each reference signal differing from the others by N decibels where N is a preselected interval, second sampling means for sampling the ($2^x-1$) comparators and encoder means operatively connected to the sampling means for producing an x bit binary representation of the selected signal whereby the x bit binary representation is the x less significant bits of an (x+y) bit binary representation of the analog output signal.

16. A circuit for converting analog signals into digital outputs comprising in combination a sample and hold circuit and a processing circuit;

said sample and hold circuit comprising analog input receiving means for receiving the analog signals; at least first, second, and third temporary storage means for temporarily storing analog signals; a first switching means for allowing or prohibiting analog signals from the analog input receiving means to be conducted to any of the first, second, and third temporary storage means, said first switching means being operatively connected with said analog input receiving means and said first, second, and third temporary storage means; a second switching means for allowing or prohibiting analog signals stored on the first, second and third temporary storage means to be conducted to a first analog output and a second analog output, said second switching means being operatively connected with the first, second, and third temporary storage means and the first and second analog analog outputs; control means for controlling the first and second switching means so as to allow cyclically each of the first, second, and third temporary storage means to be connected cyclically with the analog input receiving means, the first analog output, and the second analog output; said control means being operatively connected with said first and second switching means, whereby analog signals from the analog input receiving means are cyclically stored on the first, second, and third temporary storage means and the analog signals stored on each of the first, second, and third temporary storage means are cyclically connected with neither the first nor the second analog outputs, the first analog output and the second analog output; and said processing circuit comprising a parallel path logarithmic analog to digital converter for converting analog signals received at said analog input receiving means into digital representations comprising a first converter path of said logarithmic analog to digital converter operably connected to said first analog output, the first converter path comprising a means for converting the analog signal at said first analog output into a binary representation of the most significant bits of a digital representation of the logarithm of each analog signal temporarily stored in each of the temporary storage means, a second converter path of said logarithmic analog to digital converter operably connected to said second analog output for converting the analog signal of the second analog output into a binary representation of the next most significant bits of a digital representation of the logarithm of each analog signal temporarily stored in each of the temporary storage means.

17. The method of converting an analog signal to a digital representation of the logarithm of the analog signal comprising:
  (a) comparing the analog signal with a plurality of first reference signals differing by a first logarithmically regular increment;
  (b) determining the number of first reference signals which fail to exceed the analog signal;
  (c) converting the number of first reference signals which fail to exceed the analog signal into first digital bits representing said logarithm;
  (d) determining an attenuated analog signal which is equal to said analog signal attenuated a first number of times by said first logarithmically regular increment, wherein said first number of times is the number of first reference signals which fail to exceed the analog signal;
  (e) comparing the attenuated analog signal with a plurality of second reference signals differing by a second logarithmically regular increment;
  (f) determining the number of second reference signals which fail to exceed the attenuated analog signal; and
  (g) converting the number of second reference signals which fail to exceed the attenuated analog signal into second digital bits less significant than said first digital bits, the first and second digital bits representing said logarithm.

18. The method of claim 17 further including the steps of:
  (a) determining a second attenuated analog signal which is equal to said attenuated analog signal attenuated a second number of times by said second logarithmically regular increment wherein said second number of times is the number of second reference signals which fail to exceed the analog signal;
  (b) comparing the second attenuated analog signal with a plurality of third reference signals differing by a third logarithmically regular increment;
  (c) determining the number of third reference signals which fail to exceed the second attenuated analog signal; and
  (d) converting the number of third reference signals which fail to exceed the second analog signal into third digital bits less significant than said second digital bits, the first, second and third digital bits together representing said logarithm.

19. The method as set forth in claim 17 wherein the step of determining the attenuated analog signal comprises:
  attenuating said analog signal by said first logarithmically regular increment a plurality of times to produce a plurality of attenuated signals, said plurality of times being the same in number as said plurality of first reference signals;
  selecting from among said analog signal and said plurality of attenuated signals, the signal which has been attenuated by the first logarithmically regular increment a first number of times which first number of times is the same number as said number of first reference signals which fail to exceed the analog signal, wherein the selected signal is said attenuated analog signal.

* * * * * ic
UNITED STATES PATENT AND TRADEMARK OFFICE
CERTIFICATE OF CORRECTION

PATENT NO. : 4,232,302

DATED : November 4, 1980

INVENTOR(S) : Carl T. Jagatich

It is certified that error appears in the above-identified patent and that said Letters Patent is hereby corrected as shown below:

Column 11, line 19, between the words "converter" and "set", insert -- as --.

Column 11, line 37, "antilog" should read -- analog --;

Column 12, line 3, "references" should read -- reference --;

Column 14, line 53, delete one occurrence of the word "analog";

Signed and Sealed this

Fourth Day of January 1983

[SEAL]

Attest:

GERALD J. MOSSINGHOFF

Attesting Officer   Commissioner of Patents and Trademarks